United States Patent [19]

Wong

[11] Patent Number: 5,146,390
[45] Date of Patent: Sep. 8, 1992

[54] LCD SUPPORT BRACKET

[75] Inventor: Heiman Wong, Seattle, Wash.

[73] Assignee: John Fluke Mfg. Co., Inc., Everett, Wash.

[21] Appl. No.: 666,226

[22] Filed: Mar. 8, 1991

[51] Int. Cl.$^5$ ............................................. H05K 5/00
[52] U.S. Cl. .................................. 361/427; 174/138 G; 248/27.3; 248/500; 359/83; 361/403
[58] Field of Search ............. 235/1 D; 248/27.1, 27.3, 248/220.4, 500; 359/62, 83; 361/380, 395, 399, 427; 364/708; 428/1; 439/68, 76, 382, 630; 206/521.6, 521.7; 340/87, 784; 174/138 G

[56] References Cited

U.S. PATENT DOCUMENTS

| | | |
|---|---|---|
| 3,718,842 | 2/1973 | Abbott, III et al. ................ 361/396 |
| 3,807,833 | 4/1974 | Graham et al. ........................ 359/83 |
| 3,973,388 | 8/1976 | Yoshida et al. ....................... 359/83 |
| 4,104,727 | 8/1978 | Washizuka et al. ................. 364/708 |
| 4,113,342 | 9/1978 | Andreaggi ........................... 439/630 |
| 4,165,607 | 8/1979 | Fedorowicz et al. ................ 359/83 |
| 4,225,257 | 9/1980 | Andreaggi .......................... 248/27.1 |
| 4,545,647 | 10/1985 | Sasaki et al. ......................... 359/83 |
| 4,655,551 | 4/1987 | Washizuka et al. ................... 359/83 |
| 4,683,519 | 7/1987 | Murakami .......................... 361/424 |
| 4,728,753 | 3/1988 | Nakano .............................. 248/500 |
| 4,740,165 | 4/1988 | Tomino et al. ....................... 439/68 |
| 4,754,533 | 7/1988 | Awakowicz et al. .............. 248/27.3 |
| 4,813,642 | 3/1989 | Matsui ................................... 359/83 |
| 4,826,296 | 5/1989 | Yoshinura ............................ 359/83 |
| 4,915,341 | 4/1990 | Takahashi ............................ 359/83 |
| 5,002,368 | 3/1991 | Anglin ................................. 359/83 |

FOREIGN PATENT DOCUMENTS

| | | | |
|---|---|---|---|
| 2379087 | 8/1978 | France ................................. 359/83 |
| 0118818 | 5/1989 | Japan .................................... 359/83 |
| 0084617 | 3/1990 | Japan .................................... 359/62 |

Primary Examiner—Leo P. Picard
Assistant Examiner—Donald A. Sparks
Attorney, Agent, or Firm—Seed and Berry

[57] ABSTRACT

An LCD support bracket formed by a plurality of resilient cantilever beams projecting from a support to the lower edge of the LCD panel. The opposite edge of the LCD panel is supported by an elastomeric interconnection member that electrically connects the LCD panel to a circuit board on which the elastomeric interconnection panel is mounted. A cover having a viewing window is placed over the LCD panel to hold the LCD panel in place and to preload the resilient cantilever beams. The upper transparent pane of the LCD panel preferably extends beyond the edge of the lower transparent pane so that the resilient cantilever beams and the elastomeric member compress only the upper pane. As a result, the support bracket does not compress liquid crystal sandwiched between the upper and lower panes.

17 Claims, 2 Drawing Sheets

LCD SUPPORT BRACKET

DESCRIPTION

1. Technical Field

This invention relates to liquid crystal displays, and more particularly, to a bracket for supporting a liquid crystal display in a manner that allows the liquid crystal display to absorb shocks without preempting the area beneath the liquid crystal display.

2. Background of the Invention

Liquid crystal displays ("LCD's") are commonly used in a wide variety of electronic devices to display alphanumeric symbols. LCD's are typically fabricated by sandwiching a layer of liquid crystal between a pair of transparent panes. The transparent panes are typically glass. Since electronic devices using LCD's are sometimes dropped, banged or otherwise subject to shocks, LCD's should be shock-mounted so that shocks imparted to electronic devices do not break the glass panes in the LCD's. It is also important that LCD's be mounted so that their panes are not squeezed together too tightly since doing so may force the layer of liquid crystal from between the panes in the area where the LCD's are squeezed. Furthermore, it is desirable to mount LCD's as described above in a relatively inexpensive and compact manner so that the LCD's do not occupy an inordinate amount of space in the electronic device.

In the past, LCD's have typically been mounted in either a fixed bracket or in contact with an elastomeric interconnection member. A fixed bracket generally includes a groove into which an edge of the LCD is inserted or a ledge against which one edge of the LCD is held. Regardless of whether a grooved or a ledge is used, the clearance provided for the LCD must be sufficient to allow for variations in the thickness of the LCD which typically occurs because of inevitable manufacturing tolerances. In fact, the thickness variation for relatively inexpensive LCD's used on mass-production items such as calculators, can be substantial. The need to leave a tolerance for LCD thickness variations normally causes the LCD to be somewhat loosely mounted in the fixed bracket. This looseness causes the LCD to undergo a sudden deceleration when the electronic device in which it is mounted is dropped or otherwise subject to strong shocks. Typically, the LCD panel bows in the direction of the shock so that the supported edge of the LCD contacts the fixed bracket along a relatively sharp corner. Concentrating all of the support for the LCD along a line, i.e., the corner of the bracket, causes excessive bending stresses in the LCD thereby cracking one or more of the transparent panes of the LCD.

The use of an elastomeric interconnection member successfully shock mounts LCD's so that they are able to withstand shocks induced by dropping or banging electronic devices. However, elastomeric devices inherently support LCD's from a printed circuit board directly beneath the supported edge of the LCD. For this reason, they preempt space on the circuit board that could be used to mount components. This limitation can be very important in miniature devices in which available circuit board spaces is at a premium.

SUMMARY OF THE INVENTION

It is an object of the invention to provide a support bracket for a liquid crystal display that allows the liquid crystal display to absorb shocks imported to electronic devices in which the liquid crystal display is mounted.

It is another object of the invention to provide a support bracket for a liquid crystal display that does not preempt the space beneath the liquid crystal display.

It is still another object of the invention to provide a support bracket for a liquid crystal display that is compact and relatively inexpensive.

It is a further object of the invention to provide a support bracket for a liquid crystal display that is capable of supporting the liquid crystal display against movement in all directions.

These and other objects of the invention are provided by a bracket for supporting a liquid crystal display within a cutout formed in a generally planar support. The bracket includes a plurality of spaced apart resilient cantilever beams extending from the support along a longitudinal axis that is generally parallel to the plane of the LCD panel into the cutout to support the LCD. The LCD is also supported at least one other location. Finally, the surface of the LCD that is opposite the surface contacted by the resilient cantilever beams is biased against the cantilever beams to preload the cantilever beams, thereby shock mounting the LCD. Each of the cantilever beams preferable terminates in a support foot projecting toward and contacting the LCD. Each of the support feet preferably has a rounded end so that there are no sharp corners for the LCD to contact. The LCD preferably has one of its two transparent panes projecting beyond the edge of the other transparent pane with the resilient cantilever beams gripping only the projecting transparent pane. As a result, the resilient beams cannot compress a layer of liquid crystal sandwiched between the first and second transparent panes. The ends of the resilient beams preferably contact the edge of the recessed pane, thereby restricting movement of the LCD in a direction that is parallel to the plane of the LCD.

DETAILED DESCRIPTION OF THE INVENTION

Figure 1:
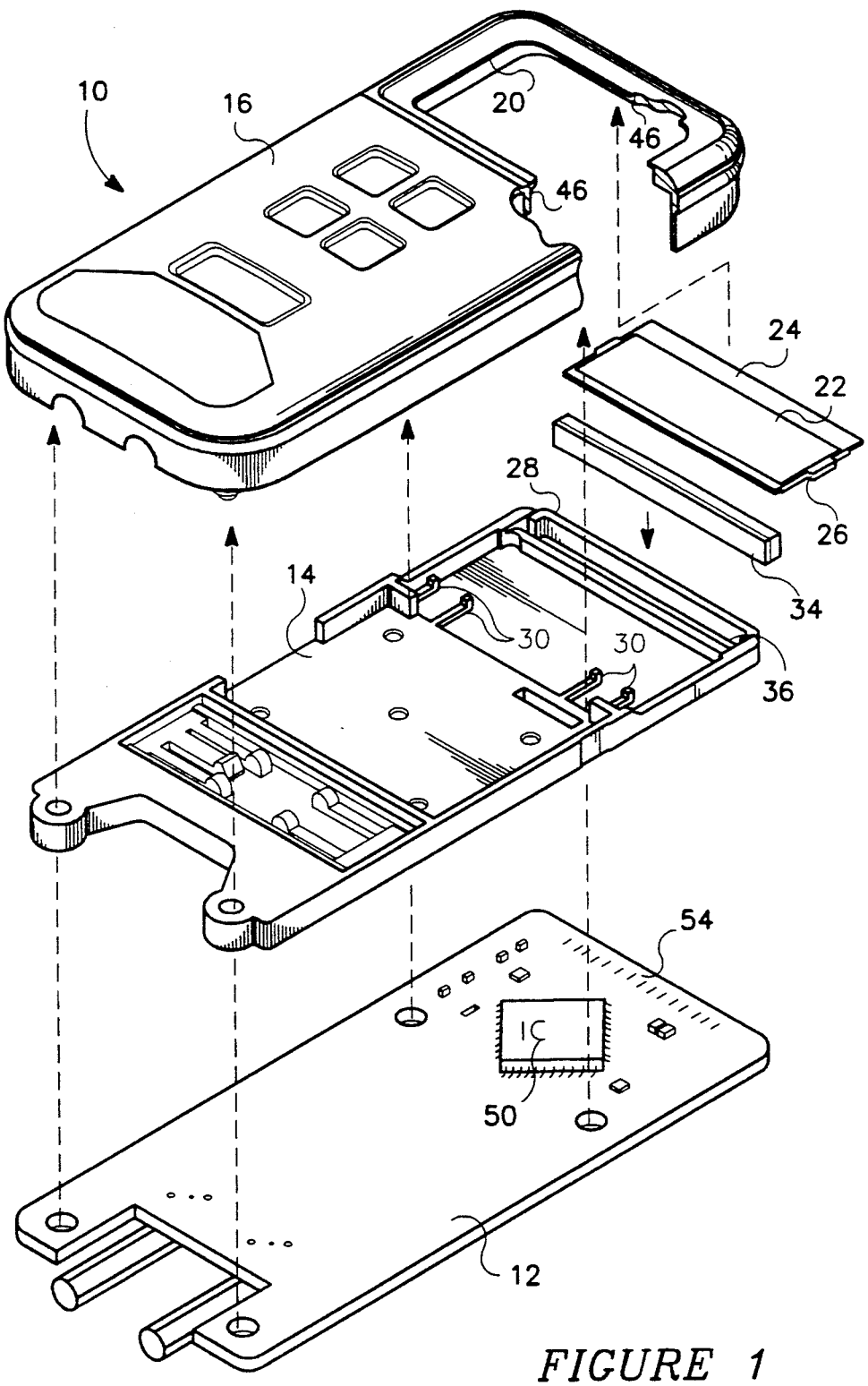
FIG. 1 is an exploded isometric view of a hand-held multimeter utilizing one embodiment of the inventive LCD support bracket.
Figure 2:
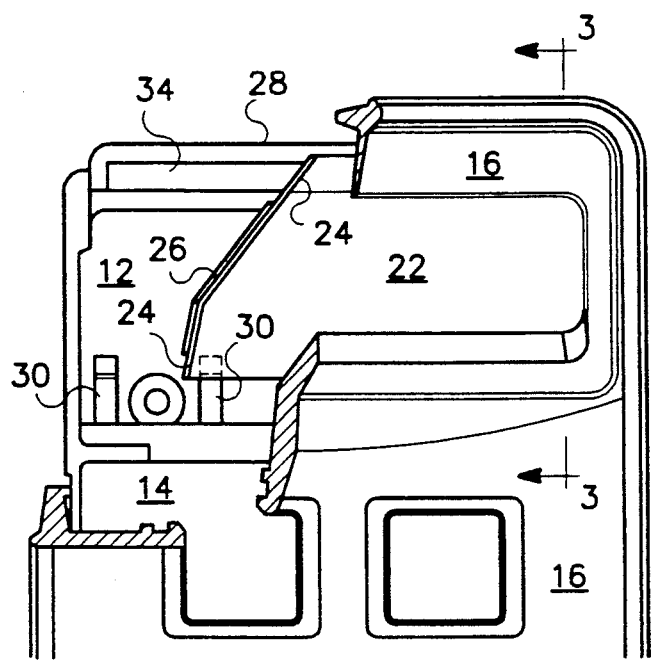
FIG. 2 is a top plan view of the LCD support bracket of FIG. 1.

One embodiment of the inventive LCD support bracket is shown in FIGS. 1 and 2 as part of a hand-held electronic multimeter 10. As is well known in the field, the electronic multimeter 10 is used to perform a variety of electrical measurements, such as measuring voltage, current, resistance, capacitance and the like. The multimeter 10 includes a printed circuit board 12 of generally rectangular configuration which is fastened to a generally rectangular support 14. The circuit board 12 and support 14 are enclosed by a generally rectangular cover 16. The cover 16 has formed therein a rectangular opening 20 through which an LCD panel 22 may be viewed. The LCD panel 22 is of the type having a layer of liquid crystal (not shown) sandwiched between first and second transparent panes 24, 26, respectively. The LCD panel 22 is mounted on the support 14. More specifically, the edge of the LCD panel 22 facing away from the end 28 of the support 14 is carried by a plurality of resilient cantilever beams 30 projecting from the support 14 horizontally in the plane of the LCD panel 22. The opposite edge of the LCD panel 22 is supported by a conventional elastomeric interconnection member 34 that is positioned within a housing 36 formed at the upper end of the support 14.

Figure 3:
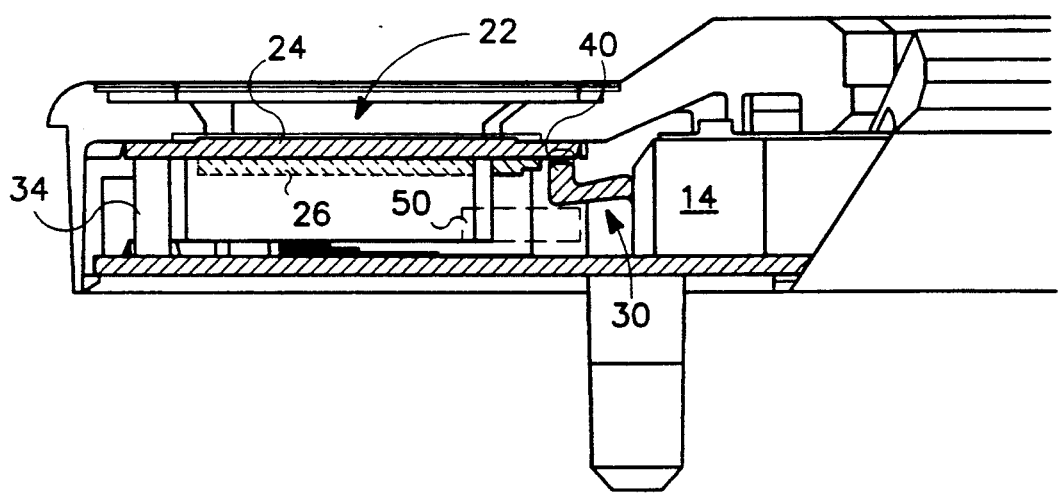
FIG. 3 is a cross-sectional view taken along the line 3—3 of FIG. 2.

With further reference, now, to FIG. 3, each resilient cantilever beam 30 terminates in a support foot 40 projecting upwardly to contact the underside of the upper transparent pane 24. The cover 16 contacts the upper surface of the transparent pane 24 along its entire parameter and forces it downwardly to bend and thus preload the resilient cantilever beams 30, as best illustrated in FIG. 3. As a result, the inventive bracket grips only one transparent pane 24 of the LCD panel, thus making is impossible for the liquid crystals sandwiched between the two panes 24, 26 to be compressed by the bracket. By avoiding compression of the liquid crystal, the performance of the LCD panel 22 is enhanced and it is less likely to be damaged during use.

As also best illustrated in FIG. 3, the end of each resilient beam 30 is spaced apart from the adjacent edge of the lower transparent pane 26. As a result, the resilient beam 30 prevents the LCD panel 22 from moving to the right as illustrated in FIG. 3. In this manner, the resilient beams 30 restrict the movement of the LCD panel 22 in a plane that is parallel to the LCD panel 22.

The LCD panel 22 is restricted from movement in other directions that are parallel to the plane of the LCD panel 22 by locator ribs 46 (FIG. 1) projecting downwardly from the cover 16 around the periphery of the opening 20.

As best illustrated in FIG. 3, since the resilient beams 30 extend from the support 14 horizontally, i.e. generally parallel to the plane of the LCD panel 22, the area beneath the supported edge of the LCD panel 22 is not preempted by any downwardly extending support structure. As a result, integrated circuit 50 can be mounted on the circuit board 12 in the area beneath the supported edge of the LCD panel 22. The area beneath the other supported edge of the LCD panel 22 is, of course, preempted by the elastomeric interconnection member 34. However, the area of the circuit board 12 beneath the other edge of the LCD panel 22 is preempted anyway by the plurality of terminals 54 (FIG. 1) that must be connected to the LCD panel 22 by the elastomeric interconnection member 34. The inventive bracket thus maximizes the use of the space on the printed circuit board for electronic components.

It is important that the LCD panel 22 be supported over a relatively large area. In particular, it is important that the LCD panel 22 not be supported by any sharp surfaces, such as by a relatively thin edge or corner of a support structure. For this reason, the upper end of the support foot 40 is preferably rounded as illustrated in FIG. 3. As a result, even if the LCD panel 22 bows inwardly in response to applied shocks or other forces, it will always contact a relatively large surface of the resilient cantilever beam 30. If the upper surface of the support foot 40 was flat, then the LCD panel 22 would contact the inner edge of the support foot 40 which, being a corner, has a relatively small area.

Although the embodiment of the inventive bracket illustrated in the drawing utilizes four resilient cantilever beams 30, it will be understood that greater or fewer beams may be used. However, the minimum number of beams can be used is two, and they must be spaced apart from each other on opposite sides of the LCD panel 22. The use of four or more resilient cantilever beams 30 distributes the LCD support forces over a greater area and thus minimizes the force that each beam must exert on the LCD panel 22.

The support 14 may be fabricated of a variety of materials as long as it is resilient and has suitable stress relaxation properties to retain its resiliency for a substantial period of time. One suitable material for the support 14, as well as the cover 16, is a polycarbonate such as GE Lexan 141 or Mobay-Merlon M40 plastic.

It is also preferable that the force exerted on the LCD panel 22 by the resilient cantilever beams 30 be approximately equal to the force exerted on the LCD panel 22 by the elastomeric interconnection member 34. By balancing the forces exerted on each side of the LCD panel 22, shocks are imparted to the LCD panel 22 equally on each side of the panel 22.

It is thus seen that the inventive LCD support bracket provides a compact and inexpensive structure for supporting an LCD panel without preempting circuit board space beneath the panel and in a manner that allows the LCD panel to absorb shocks during use.

I claim:

1. A bracket supporting a substantially planar liquid crystal display ("LCD") panel in a cutout formed in a generally planar support, said bracket comprising:
   a plurality of spaced apart resilient cantilever beams extending from a location of said support that is substantially coplanar with said LCD panel into said cutout and contacting a surface of said LCD panel to support said panel within said cutout, a major portion of said resilient beams extending along a longitudinal axis that is generally parallel to the plane of said LCD panel;
   support means supporting said LCD panel in at least one other location; and
   retaining means contacting a surface of said LCD panel that is opposite a surface of said LCD panel that is contacted by said resilient cantilever beams, said retaining means displacing said LCD panel against said cantilever beams with sufficient force to bend said beams so that they are preloaded against said LCD panel thereby shock mounting said LCD panel in said support without preempting an area beneath said LCD panel and the area beneath said cantilever beams.

2. The support bracket of claim 1 wherein each of said resilient cantilever beams terminate in a projection extending toward and contacting said LCD panel, each of said projections having a rounded end so that there are no sharp corners for said LCD panel to contact.

3. The support bracket of claim 1 wherein said resilient cantilever beams are four in number.

4. The support bracket of claim 3 wherein said cantilever beams are arranged in two closely spaced pairs with one pair being positioned adjacent each end of said panel.

5. The support bracket of claim 1 wherein said support means comprise an elastomeric interconnection member extending from a printed circuit board to a plurality of terminals on the surface of said LCD panel that are contacted by said resilient cantilever beam whereby said elastomeric interconnection member both delivers signals to and supports one edge of said LCD panel.

6. The support bracket of claim 1 wherein said LCD panel includes a layer of liquid crystal positioned between first and second transparent panes, said first pane having an edge projecting beyond an adjacent edge of said second pane, and wherein said LCD panel is placed in said cutout with said retaining means contacting one surface of said first pane and said resilient cantilever beams contacting a portion of the opposite surface of said first pane that projects beyond the edge of said second pane so that said resilient cantilever beams avoid compressing said liquid crystal between said first and second panes.

7. The support bracket of claim 6 wherein the ends of said resilient cantilever beams contact the adjacent edge of said second pane thereby restricting movement of said LCD panel in a direction that is parallel to the plane of said LCD panel.

8. The support bracket of claim 1 further including restraining means for restraining said LCD panel from moving in a direction that is parallel to the plane of said LCD panel.

9. The support bracket of claim 8 wherein said restraining means includes a plurality of ribs extending from said retaining means to at least partially surround said LCD panel so that said ribs can prevent movement of said LCD panel in a direction that is parallel to the plane of said LCD panel.

10. In an electronic device having a case including a cover, a planar circuit board contained within said case having a plurality of circuit components mounted on at least one of its surfaces, a support member positioned adjacent said circuit board, and a liquid crystal display (LCD) panel connected to at least some of the circuit components on said circuit board and viewable through said cover, an improved bracket supporting said LCD panel directly above said circuit board without preventing said circuit components from being mounted on said circuit board beneath said LCD panel, said bracket comprising a plurality of spaced apart resilient cantilever beams extending from a location of said support member that is substantially coplanar with said LCD panel along a longitudinal axis, a major portion of which is substantially parallel to the plane of said circuit board, said cantilever beams contacting a surface of said LCD panel to support said panel above said circuit board, whereby said LCD panel is supported from the side of said LCD panel thereby leaving the area beneath said LCD panel available for circuit components.

11. The bracket of claim 10 wherein said cover contacts a surface of said LCD panel that is opposite a surface of said LCD panel that is contacted by said resilient cantilever beams, said cover displacing said LCD panel against said cantilever beams with sufficient force to bend said cantilever beams so that they are preloaded against said LCD panel thereby shock mounting said LCD panel in said support.

12. The support bracket of claim 11 wherein said LCD panel includes a layer of liquid crystal positioned between first and second transparent panes, said first pane having an edge projecting beyond an adjacent edge of said second pane, and wherein said LCD panel is mounted with said cover contacting one surface of said first pane and said resilient cantilever beams contacting a portion of the opposite surface of said first pane that projects beyond the edge of said second pane so that said resilient cantilever beams avoid compressing said liquid crystal between said first and second panes.

13. The bracket of claim 12 wherein the ends of said resilient cantilever beams contact the adjacent edge of said second pane thereby restricting movement of said LCD panel in a direction that is parallel to the plane of said LCD panel.

14. The bracket of claim 11 wherein each of said resilient cantilever beams terminate in a projection extending toward and contacting said LCD panel, each of said projections having a rounded end so that there are no sharp corners for said LCD panel to contact.

15. The bracket of claim 10 wherein said resilient cantilever beams are four in number.

16. The bracket of claim 10 wherein said LCD panel is positioned adjacent a first end of said cover, wherein said resilient cantilever beams extend toward said first end to contact said LCD panel near an edge of said LCD panel positioned away from said first end, and wherein said bracket further includes an elastomeric interconnection member extending from said printed circuit board to a plurality of terminals on the surface of said LCD panel that is contacted by said resilient cantilever support beams, said elastomeric interconnection member being positioned adjacent said first end and contacting said LCD panel adjacent an edge of said panel that is positioned adjacent said first end, whereby said bracket blocks circuit components from being mounted on a portion of said circuit board only at the edge of said circuit board adjacent said first end.

17. The bracket of claim 10 further including a plurality of ribs extending from said cover to at least partially surround said LCD panel so that said ribs prevent movement of said LCD panel in a direction that is parallel to the plane of said LCD panel.

* * * * *